(12) United States Patent
Yoon et al.

(10) Patent No.: US 9,942,987 B2
(45) Date of Patent: Apr. 10, 2018

(54) COIL COMPONENT AND BOARD HAVING THE SAME

(71) Applicant: SAMSUNG ELECTRO-MECHANICS CO., LTD., Suwon-si, Gyeonggi-do (KR)

(72) Inventors: Chan Yoon, Suwon-si (KR); Dong Hwan Lee, Suwon-si (KR); Young Ghyu Ahn, Suwon-si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/229,354

(22) Filed: Aug. 5, 2016

(65) Prior Publication Data

US 2017/0150606 A1 May 25, 2017

(30) Foreign Application Priority Data

Nov. 19, 2015 (KR) .................. 10-2015-0162388

(51) Int. Cl.
*H01F 27/02* (2006.01)
*H01F 5/00* (2006.01)
(Continued)

(52) U.S. Cl.
CPC .......... *H05K 1/181* (2013.01); *H01F 27/292* (2013.01); *H05K 3/3442* (2013.01);
(Continued)

(58) Field of Classification Search
CPC .................... H01F 5/00; H01F 27/28
(Continued)

(56) References Cited

U.S. PATENT DOCUMENTS 6,154,114 A * 11/2000 Takahashi ............. H01F 27/292
336/200
2007/0188288 A1 * 8/2007 Ishii .................... H01F 17/0013
336/200
(Continued)

FOREIGN PATENT DOCUMENTS

JP 2000315617 A * 11/2000
JP 2010-010425 A 1/2010
(Continued)

OTHER PUBLICATIONS

Korean Office Action dated Nov. 11, 2016 issued in Korean Patent Application No. 10-2015-0162388 (with English translation).

*Primary Examiner* — Tsz Chan
(74) *Attorney, Agent, or Firm* — McDermitt Will & Emery LLP

(57) ABSTRACT

A coil component includes: an internal coil; a magnetic body having the internal coil embedded therein, and having first and second surfaces opposing each other in a first direction, third and fourth surfaces opposing each other in a second direction, and fifth and sixth surfaces opposing each other in a third direction; and external electrodes connected to the internal coil and disposed on outer surfaces of the magnetic body. 0<T1/T2<1, where T1 is a thickness of the magnetic body at a central axis of the internal coil, and T2 is a thickness of the magnetic body at a point B positioned to be spaced apart from the central axis of the internal coil by a predetermined distance.

18 Claims, 10 Drawing Sheets

(51) Int. Cl.
    *H01F 27/28*    (2006.01)
    *H05K 1/18*     (2006.01)
    *H01F 27/29*    (2006.01)
    *H05K 3/34*     (2006.01)

(52) U.S. Cl.
    CPC ............... *H05K 2201/1003* (2013.01); *H05K 2201/10636* (2013.01); *Y02P 70/611* (2015.11)

(58) Field of Classification Search
    USPC ........................................ 336/83, 200, 232
    See application file for complete search history.

(56) References Cited

U.S. PATENT DOCUMENTS

2009/0256668 A1\* 10/2009 Noma ................. H01F 17/0013
                                                    336/200
2010/0225437 A1    9/2010 Ueda et al.
2014/0097921 A1\*  4/2014 Ohtsubo ............... H01F 27/292
                                                    336/83

FOREIGN PATENT DOCUMENTS

| JP | 2014-132630 A    | 7/2014  |
|----|------------------|---------|
| KR | 10-2004-0106985 A | 12/2004 |
| KR | 10-2010-0061806 A |  6/2010 |
| KR | 10-1558092 B1    | 10/2015 |

\* cited by examiner

| Sample | T1/T2 | Irms [A] |
|---|---|---|
| INVENTIVE EXAMPLE 1 | 0.91 | 0.618 |
| INVENTIVE EXAMPLE 2 | 0.92 | 0.609 |
| INVENTIVE EXAMPLE 3 | 0.93 | 0.602 |
| INVENTIVE EXAMPLE 4 | 0.94 | 0.596 |
| INVENTIVE EXAMPLE 5 | 0.95 | 0.589 |
| INVENTIVE EXAMPLE 6 | 0.96 | 0.584 |
| INVENTIVE EXAMPLE 7 | 0.97 | 0.583 |
| INVENTIVE EXAMPLE 8 | 0.98 | 0.582 |
| INVENTIVE EXAMPLE 9 | 0.99 | 0.581 |
| COMPARATIVE EXAMPLE 1 | 1 | 0.58 |

FIG. 6A

COIL COMPONENT AND BOARD HAVING THE SAME

CROSS-REFERENCE TO RELATED APPLICATION

This application claims the benefit of priority to Korean Patent Application No. 10-2015-0162388, filed on Nov. 19, 2015 with the Korean Intellectual Property Office, the entirety of which is incorporated herein by reference.

BACKGROUND

The present disclosure relates to a coil component and a board having the same.

In accordance with the development of smartphones, demand has increased for a thinned power inductor having a high current, high efficiency, high performance, and a compact size.

For example, a product having a 2520 size and a thickness of 1 mm and a product having a 2016 size and a thickness of 1 mm have been used in the past. A miniaturized product having a 1608 size and a thickness of 0.8 mm has been developed.

Therefore, demand has increased for a low profile power inductor, as well as a decrease in a length and a width of the power inductor. In addition, there is a trend toward the development of an integrated circuit (IC) chip from a conventional chip-scale package (CSP) into a wafer CSP at a more rapid speed.

When a direct current (DC) current flows to a coil in the power inductor, heat is generated by a resistance of the coil. In addition, even in a case in which an alternating current (AC) current is applied, loss is generated due to a skin effect or loss of a magnetic material, which also generates heat.

The heat generated by the coil may damage the insulator enclosing the coil, and may increase the possibility that a short circuit between coils will be generated. In addition, when a temperature of the magnetic material rises some degrees, magnetic property is rapidly deteriorated, which causes a rapid decrease in inductance.

Therefore, in accordance with the trend toward the low profile power inductor, heat radiation of the power inductor should be improved in order to secure high efficiency and reliability of the power inductor.

SUMMARY

An aspect of the present disclosure provides a coil component having an improved heat radiating function, and a board having the same.

According to an aspect of the present disclosure, a coil component includes: an internal coil; a magnetic body having the internal coil embedded therein, and having first and second surfaces opposing each other in a first direction, third and fourth surfaces opposing each other in a second direction, and fifth and sixth surfaces opposing each other in a third direction; and external electrodes connected to the internal coil and disposed on outer surfaces of the magnetic body. $0<T1/T2<1$, where T1 is a thickness of the magnetic body at a central axis of the internal coil, and T2 is a thickness of the magnetic body at a point B positioned to be spaced apart from the central axis of the internal coil by a predetermined distance.

According to another aspect of the present disclosure, a board having a coil component includes: a printed circuit board having a plurality of electrode pads disposed thereon; and the coil component installed on the printed circuit board, wherein the coil component includes: an internal coil; a magnetic body having the internal coil embedded therein, and having first and second surfaces opposing each other in a first direction, third and fourth surfaces opposing each other in a second direction, and fifth and sixth surfaces opposing each other in a third direction; and external electrodes connected to the internal coil and disposed on outer surfaces of the magnetic body. $0<T1/T2<1$, where T1 is a thickness of the magnetic body at a central axis of the internal coil, and T2 is a thickness of the magnetic body at a point B positioned to be spaced apart from the central axis of the internal coil by a predetermined distance.

BRIEF DESCRIPTION OF DRAWINGS

The above and other aspects, features, and advantages of the present disclosure will be more clearly understood from the following detailed description taken in conjunction with the accompanying drawings, in which:

FIG. 6A is a table representing Irms of the coil component according to an exemplary embodiment in the present disclosure.

DETAILED DESCRIPTION

Figure 1:
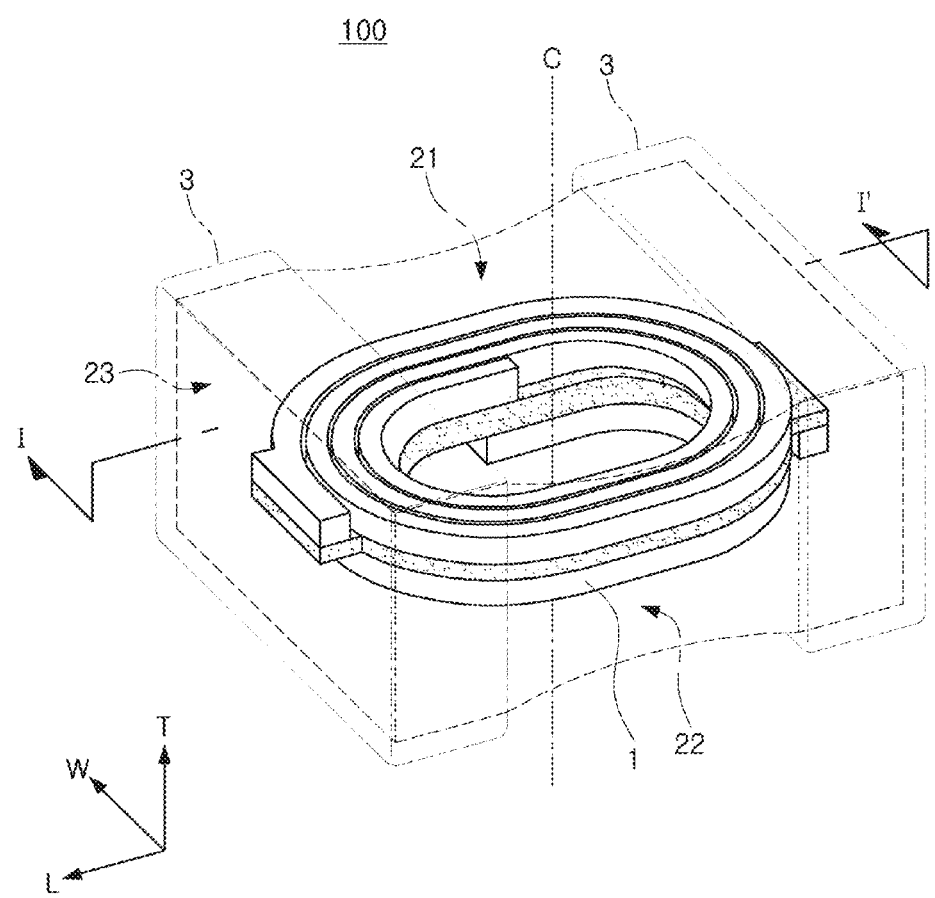
FIG. 1 is a schematic perspective view of a coil component according to an exemplary embodiment in the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Hereinafter, a coil component and a board having the same according to an exemplary embodiment in the present disclosure will be described. However, the present disclosure is not limited thereto.

Coil Component

FIG. 1 is a schematic perspective view of a coil component according to an exemplary embodiment in the present disclosure.

Referring to FIG. 1, a coil component 100 according to an exemplary embodiment in the present disclosure may include an internal coil 1, a magnetic body 2 embedding the internal coil 1 therein, and external electrodes 3 disposed on outer surfaces of the magnetic body 2.

The internal coil 1 may have a central axis C thereof. The central axis C of the internal coil 1 may coincide with a magnetic core of the internal coil 1.

The internal coil 1 may have a spiral shape, but is not limited thereto.

The magnetic body 2 having the internal coil 1 embedded therein may have first and second surfaces 21 and 22 opposing each other in a first direction, third and fourth surfaces opposing each other in a second direction, and fifth and sixth surfaces opposing each other in a third direction.

In this case, the first direction refers to a thickness direction (T-direction) of the magnetic body, the second direction refers to a length direction (L-direction) of the magnetic body, and the third direction refers to a width direction (W-direction) of the magnetic body.

In addition, the first and second surfaces 21 and 22 of the magnetic body 2 may be symmetrical to each other in all of the first to third directions based on a central portion sharing the central axis C of the internal coil 1.

Referring to FIG. 1, a distance between the first and second surfaces 21 and 22 may be shortest in the central portion of the internal coil. In addition, the more distant from the central portion, the longer the distance between the first and second surfaces 21 and 22.

Although a case in which the first surface 21 is concave toward the second surface 22 based on the central axis C of the internal coil and the second surface 22 is concave toward the first surface 21 based on the central axis C of the internal coil has been illustrated by way of example in FIG. 1, the first and second surfaces 21 and 22 are not limited thereto.

For example, it may be sufficient that a distance from an intersecting point between the central axis C of the internal coil and the first surface 21 to the second surface 22 is shortest among distances from the first surface 21 of the magnetic body to the second surface 22 of the magnetic body.

A form of the coil component according to an exemplary embodiment in the present disclosure will be described in more detail with reference to FIG. 2.

Figure 2:
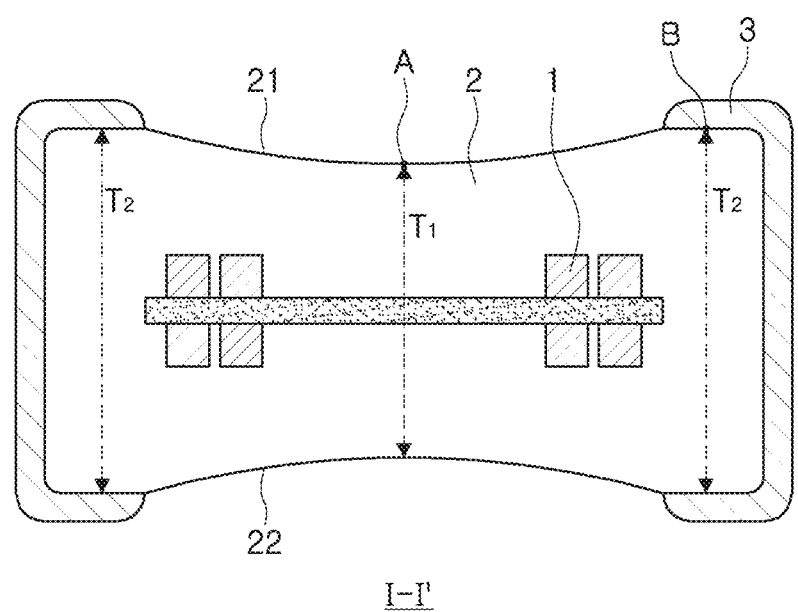
FIG. 2 is a schematic cross-sectional view taken along line I-I' of FIG. 1.

Referring to FIG. 2, in the first and second surfaces 21 and 22 of the magnetic body opposing each other in the first direction, a point positioned on the central axis C of the internal coil and positioned at the center of the first surface 21 is a point A, and a point positioned to be spaced apart from the central axis C of the internal coil 1 by a predetermined distance and positioned on the first surface 21 is a point B. In this case, the point B may be any one point on the first surface 21 except for the intersecting point between the central axis C of the internal coil and the first surface 21.

In this case, when a distance from the point A to the second surface 22 is T1 and a distance from the point B to the second surface 22 is T2, T1 may be smaller than T2.

In other words, at least one of the first and second surfaces 21 and 22 of the magnetic body 2 in the coil component 100 may have a shape different from a flat shape.

In a case in which at least one of the first and second surfaces 21 and 22 of the magnetic body 2 in the coil component has the shape different from the flat shape, a contact area between the first and second surfaces 21 and 22 of the magnetic body 2 and the surrounding air may be increased as compared to in a case in which the first and second surfaces 21 and 22 of the magnetic body 2 are substantially flat.

In addition, a volume of the magnetic body 2 and distances from the internal coil to the first and second surfaces 21 and 22 may also be decreased as compared to in the case in which the first and second surfaces 21 and 22 of the magnetic body 2 are substantially flat.

As a result, heat generated from the internal coil 1 may be more easily externally radiated from the first surface 21 or the second surface 22 of the magnetic body 2.

FIG. 2 illustrates a case in which the point B, that is a point positioned to be spaced apart from the central axis C of the internal coil 1 and positioned on the first surface 21, is positioned in a region in which the external electrode 3 and the magnetic body 2 overlap each other. In this case, the first surface 21 may be flat in a region in which it overlaps the external electrode 3, and may be concave in other regions. In addition, the second surface may be flat in a region in which it overlaps the external electrode 3, and may be concave in other regions.

Figure 3A:
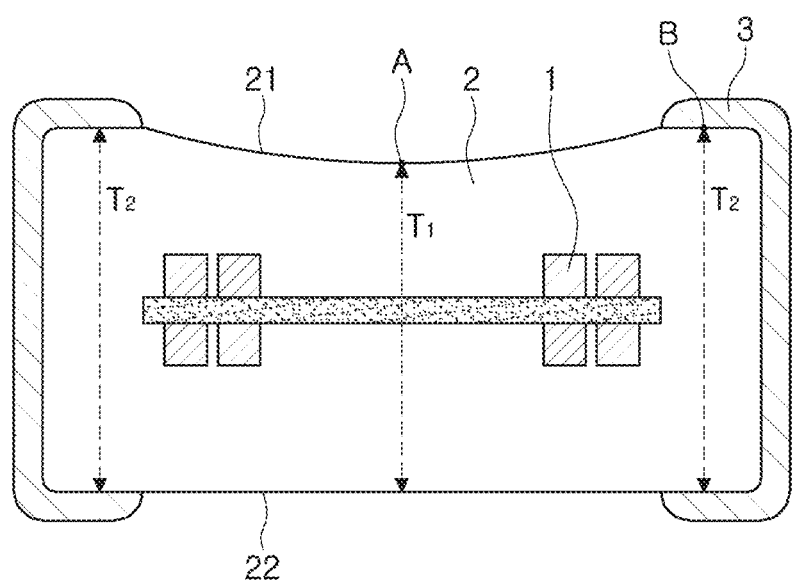
FIGS. 3A through 3C are schematic cross-sectional views of modified examples of FIG. 2.
Figure 3B:
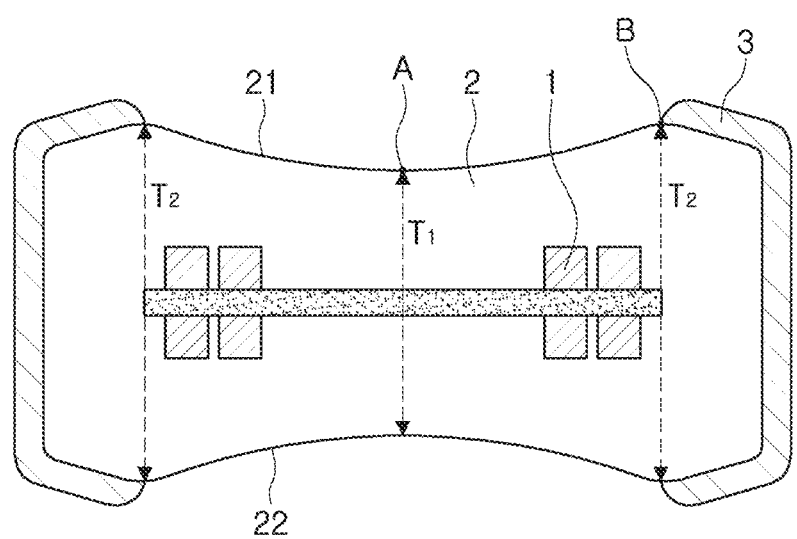
Figure 3C:
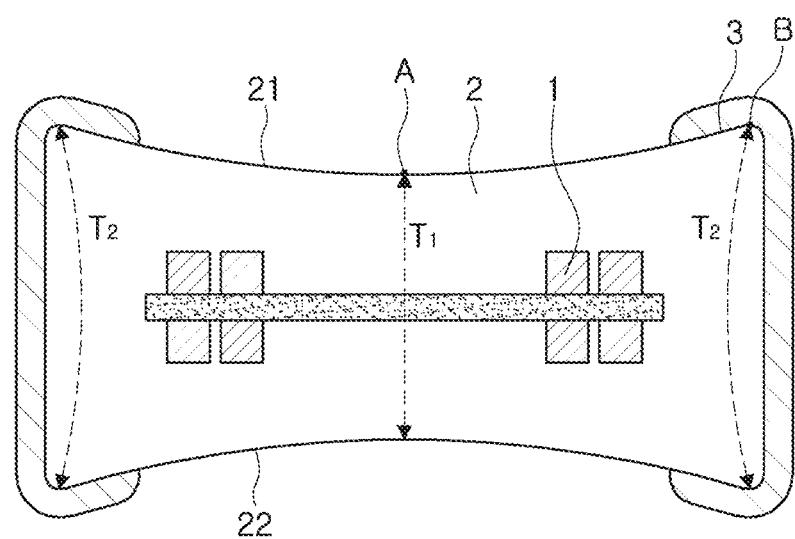

Next, FIGS. 3A through 3C schematically illustrate modified examples of FIG. 2.

First, FIG. 3A illustrates a coil component in which a first surface 21 of a magnetic body 2 is flat in a region in which it overlaps with an external electrode 3 and is concave based on a central axis C of an internal coil in other regions and a second surface 22 of the magnetic body 2 is flat. That is, in FIG. 3A, the first surface 21 may have a concave region, and the second surface 22 may be flat.

The magnetic body 2 of the coil component 100 illustrated in FIG. 3A may radiate more heat to the surrounding air as compared to in a case in which both of the first and second surfaces 21 and 22 are flat.

In addition, FIG. 3B illustrates a coil component in which a distance from a point A positioned on a central axis C of an internal coil in a magnetic body 2 and positioned at the center of a first surface 21 to a second surface is minimal, and a distance from an end portion B of a region in which an external electrode 3 and a magnetic body overlap each other to the second surface 22 is maximal. The magnetic body 2 of the coil component 100 illustrated in FIG. 3B may radiate more heat to the surrounding air as compared to a case in which both of the first and second surfaces 21 and 22 are flat. In addition, in this case, since the distance from the end portion B of the region in which the external electrode 3 and the magnetic body 2 overlap each other to the second surface 22 is maximal, coupling force between the external electrode 3 and the magnetic body 2 may be increased.

Next, FIG. 3C illustrates a coil component in which a distance from a point A positioned on a central axis C of an internal coil 1 in a magnetic body 2 and positioned at the center of a first surface 21 to a second surface 22 is minimal, and a distance from an end portion B of the first surface 21, which is a point most distant from the central axis C of the internal coil 1 in the second direction, to the second surface 22 is maximal, similar to FIGS. 3A and 3B. That is, in FIG. 3C, the first surface 21 may have a concave shape, and the second surface 22 may have a concave shape.

The magnetic body 2 of the coil component 100 illustrated in FIG. 3C may radiate more heat to the surrounding air as compared to a case in which both of the first and second surfaces are flat, similar to FIGS. 3A and 3B.

In connection with this, in the coil component according to an exemplary embodiment, a method of changing shapes of the first and second surfaces 21 and 22 of the magnetic body 2 in the coil component is not particularly limited as long as a distance T1 from the first surface to the second surface at the central portion of the internal coil 1 is smaller than a distance T2 from the first surface to the second surface in regions other than the central portion of the internal coil 1.

For example, a process of pressing the magnetic body 2 when the coil component is manufactured may be performed. In this case, a method of pressing the magnetic body 2 having the internal coil 1 embedded therein using a mold having a structure in which a central portion protrudes downwardly based on the central axis C of the internal coil 1 may be used. However, the method of changing the shapes of the first and second surfaces 21 and 22 of the magnetic body 2 is not limited thereto.

Figure 4:
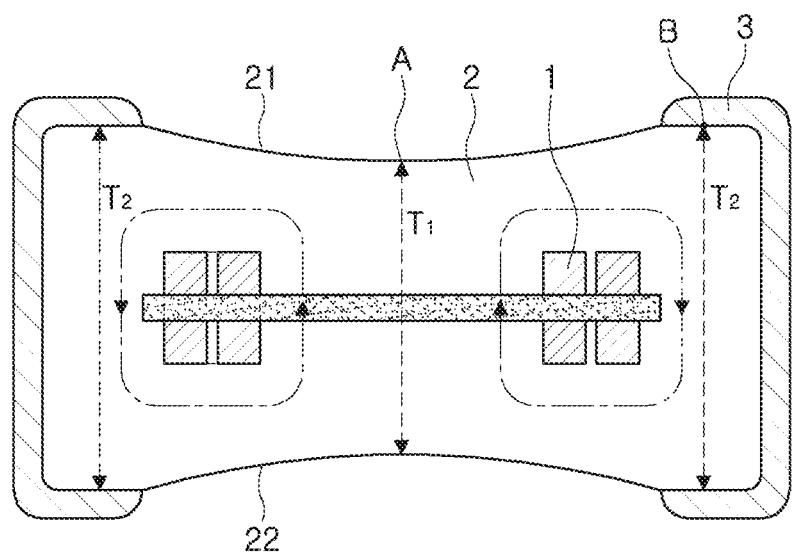
FIG. 4 is a cross-sectional view of FIG. 2 to which a schematic flow of a magnetic flux of the coil component according to an exemplary embodiment in the present disclosure is added.

FIG. 4 is a cross-sectional view of FIG. 2 to which a schematic flow of a magnetic flux of the internal coil 1 is added. Referring to FIG. 4, even if the coil component 100 according to an exemplary embodiment in the present disclosure is modified from a component according to the related art so that the distance from the first surface 21 to the second surface 22 at the central portion of the internal coil 1 is shorter than a distance from the center of a first surface 21 to a second surface 22 in the coil component according to the related art, a flow of a magnetic flux is not changed. That is, an inductance of the coil component 100 according to an exemplary embodiment may be maintained as an inductance that is substantially the same as that of the coil component according to the related art.

Nevertheless, the heat radiated to the surrounding air through the first surface 21 or the second surface 22 of the magnetic body 2 may be further improved, and thus heat generated in the coil component may be radiated further. As a result, a temperature of the coil component when the coil component is driven may be lowered to increase Irms. Here, Irms indicates a current value (Ampere) when a temperature of the coil component rises from 25° C., which is generally the surrounding temperature, by 40° C. That is, Irms is defined as a current value in a case in which the temperature of the coil component becomes 65° C., when a current is increased from 0. Heat radiation performance of the coil component may be recognized through Irms, and the larger the value of Irms, the more excellent the heat radiation performance of the coil component.

Table 1 compares inductances (L), direct current (DC) resistances (Rdc), and values of Irms between a coil component (Comparative Example) according to the related art in which first and second surfaces of a magnetic body are flat and a coil component (Experimental Example) according to an exemplary embodiment in the present disclosure in which T1/T2, a ratio between a minimum distance T1 and a maximum distance T2 between first and second surfaces of a magnetic body is 0.93, in a 10RO model having a 2016 size and a thickness of 0.65 T.

In the Experimental Example, a distance T1 between the first and second surfaces at the central portion of the internal coil is changed from that of the Comparative Example.

TABLE 1

| | Comparative Example (Structure According to the Related Art) | Experimental Example (Structure According to the Exemplary Embodiment) |
| --- | --- | --- |
| T1/T2 (Minimum Value/Maximum Value) | 1 (T1 = T2) | 0.93 |
| Inductance (L) [µH] | 9.01 | 9.00 |
| Rdc [mOhm] | 1100 | 1100 |
| Irms [A] | 0.58 | 0.6 |

Referring to Table 1, a value of Irms in a case (Experimental Example) in which the first surface of the magnetic body has a concave shape and the second surface of the magnetic body has a concave shape is larger than that of Irms in a case (Comparative Example) in which the first and second surfaces of the magnetic body have a flat shape by 0.02 A. This means that in the case of the Experimental Example, heat generated from the internal coil is radiated more effectively through the first and second surfaces. The detailed reason is that surface areas of the first and second surfaces in the Experimental Example are greater than those of the first and second surfaces in the Comparative Example, and the distance from the internal coil to the first and second surfaces in the Experimental Example is shorter than the distance from the internal coil to the first and second surfaces in the Comparative Example.

When comparing the Comparative Example and the Experimental Example with each other, inductances (L) and DC resistances (Rdc) of the coil components are substantially the same as each other. The reason is that the DC resistance of the internal coil is determined by three factors such as specific resistances defined by a material, or the like, of the internal coil, an area of the internal coil, and a length of the internal coil, and the internal coil used in the Comparative Example is the same as the internal coil used in the Experimental Example.

In addition, as described above with reference to FIG. 4, even if shapes of the first and second surfaces of the magnetic body are changed from the flat shape to the concave shape, the flow of the magnetic flux is not substantially affected, and thus the inductance of the coil component is not substantially changed.

Figure 5:
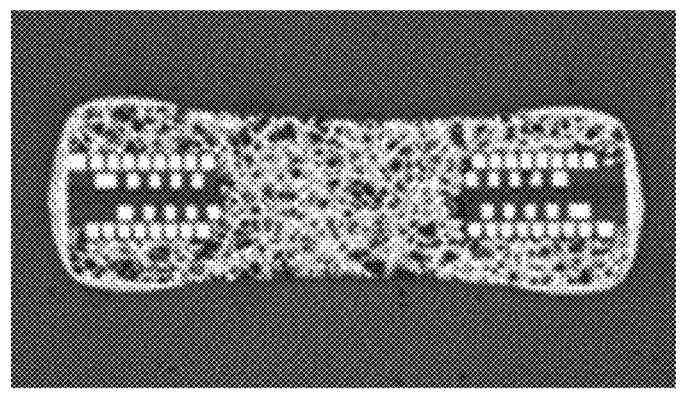
FIG. 5 is a photograph of a cross section of the coil component according to an exemplary embodiment in the present disclosure (Inventive Example 1)

Next, a photograph of a cross section of the coil component according to the Experimental Example of Table 1 is illustrated in FIG. 5. It may be appreciated that surface areas of the first and second surfaces 21 and 22 of the magnetic body 2 and contact areas between the first and second surfaces 21 and 22 and the surrounding air in the coil component according to the Experimental Example of FIG. 5 are wider than surface areas of the first and second surfaces of the magnetic body and contact areas between the first and second surfaces and the surrounding air in a case in which both of the first and second surfaces are flat.

Figure 6B:
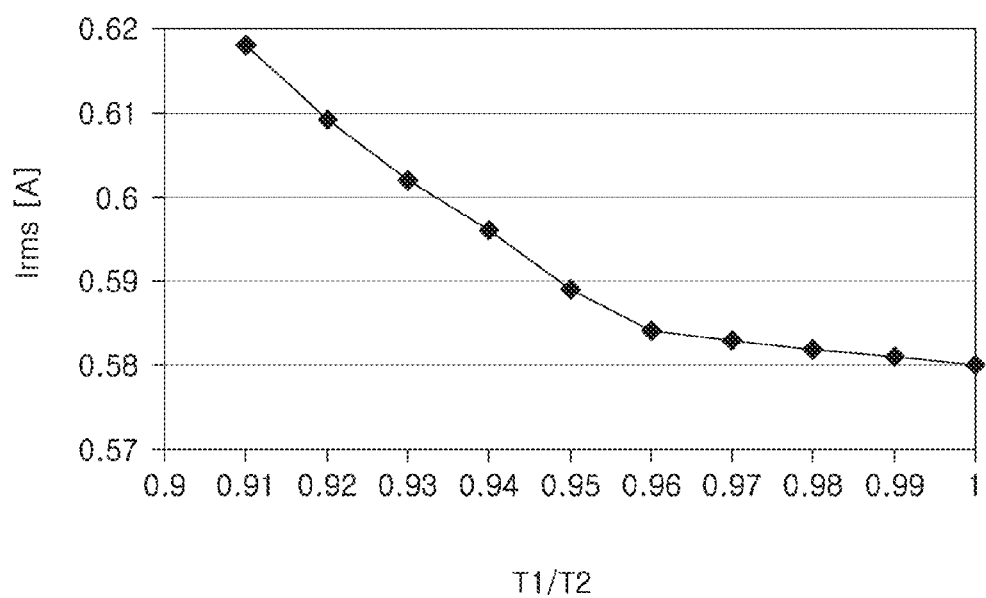
FIG. 6B is a graph for FIG. 6A.

FIG. 6A is a table representing Irms of the coil component according to an exemplary embodiment in the present disclosure, and FIG. 6B is a graph corresponding to the table shown in FIG. 6A.

Referring to FIG. 6A, a coil component used to measure Irms in Comparative Example 1 is a power inductor of a 10RO model having a 2016 size and a thickness of 0.65 mm, and coil components used to measure Irms in Inventive Examples 1 to 9 are power inductors in which a distance T1 between a first surface and a second surface at a central portion of an internal coil is changed in relation to Comparative Example 1.

In FIGS. 6A and 6B, T1, which is the distance from the first surface to the second surface at the central portion of the internal coil, may be a minimum distance among distances from the first surface to the second surface, and T2, which is a thickness of the magnetic body 2, may be a maximum distance among the distances from the first surface to the second surface.

In this case, T2 is defined as a distance from a region of the first surface of the magnetic body overlapping the external electrode to the second surface, and may determine a thickness of the magnetic body, but is not limited thereto. That is, it may be sufficient that T2 is the maximum distance among the distances from the first surface to the second surface.

FIG. 6B is a graph for FIG. 6A, and it may be confirmed that Irms is 0.58 A in a case in which the distance from the first surface to the second surface is constant, such that T1/T2 is 1, that is, in a case (Comparative Example 1) in which the first and second surfaces of the magnetic body are flat, while Irms is gradually decreased as compared to 0.58 A in a case in which T2 is constantly maintained to make a thickness of the coil component constant and T1 is gradually decreased to gradually decrease T1/T2.

In addition, in a case in which T1/T2 is less than 0.96, a value of Irms of the coil component is significantly increased. Therefore, it may be appreciated that coil components in the case in which T1/T2 is less than 0.96 radiate a very large amount of heat to the surrounding air.

In a case in which T1/T2 is 0.90 or less, a value of Irms of a coil component may be increased. In this case, however, a difference between the thickness T2 of the coil component and the thickness of the central portion of the coil component is large, and thus there is a risk that mechanical strength of the coil component will not be secured, and there is a risk that the internal coil embedded in the magnetic body will be exposed.

A thickness T2 of a body of the coil component according to an exemplary embodiment may be appropriately determined in consideration of the purpose of the coil component, a size of a board, a limitation in a process, and the like, but may correspond to 0.5 mm to 0.65 mm. This means that the coil component according to an exemplary embodiment may be preferably used in a low profile coil component in which a volume of a magnetic body is small due to a reduced thickness of the coil component itself.

Board Having Coil Component

Figure 7:
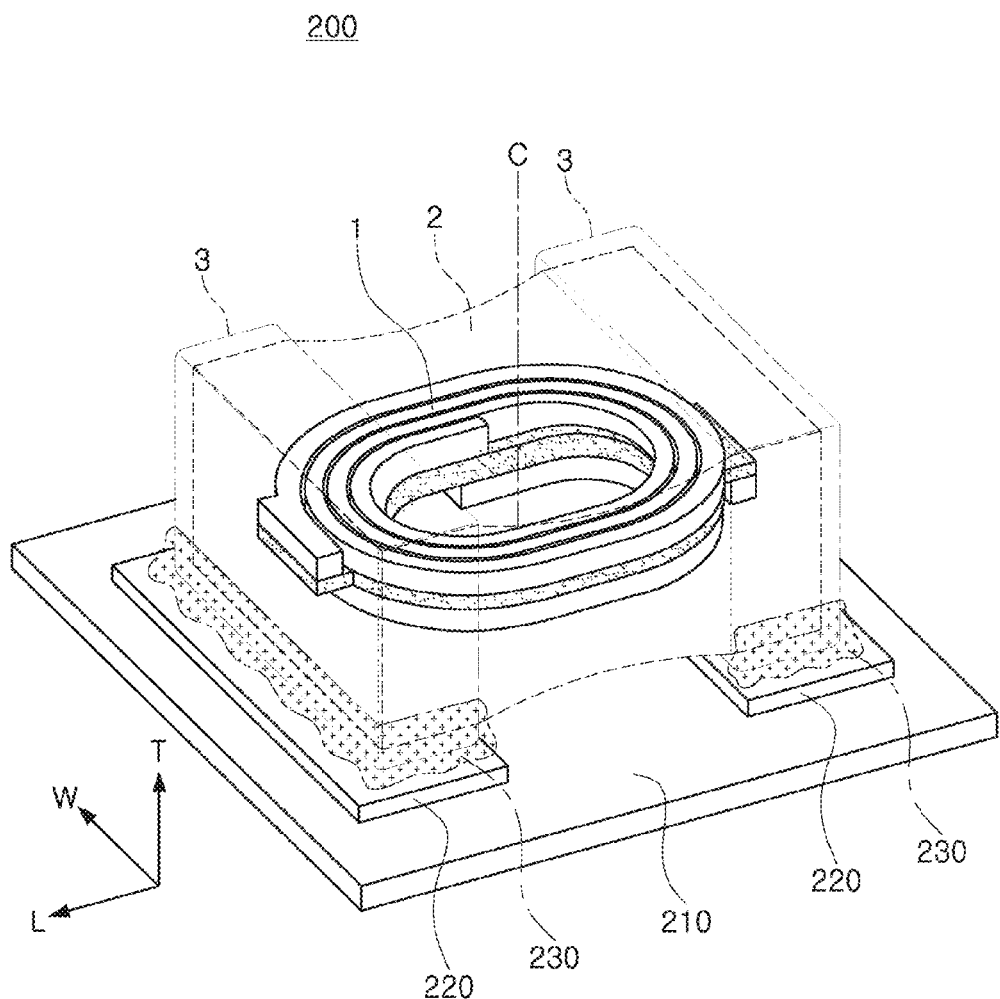
FIG. 7 is a schematic perspective view illustrating a form in which the coil component of FIG. 1 is mounted on a board.

FIG. 7 is a schematic perspective view illustrating an exemplary embodiment in which the coil component of FIG. 1 is mounted on a board.

Referring to FIG. 7, a board 200 having a coil component according to an exemplary embodiment may include a printed circuit board 210 on which the coil component 100 is mounted, and a plurality of electrode pads 220 formed on an upper surface of the printed circuit board 210 to be spaced apart from each other.

In this case, the second surface 22 of the magnetic body of the coil component may face an upper surface of the printed circuit board.

Meanwhile, the external electrodes 3 of the coil component may be electrically connected to the printed circuit board 210 by solders 230 in a state in which they are positioned on the electrode pads 220, respectively, to contact the electrode pads 220, respectively.

A description of features overlapping those of the coil component according to the exemplary embodiment described above except for the above-mentioned description will be omitted.

As set forth above, according to an exemplary embodiment in the present disclosure, the coil component that may effectively radiate the heat generated from an inner portion thereof, and the board having the same, may be provided.

According to an exemplary embodiment in the present disclosure, the coil component having excellent Irms, and the board having the same, may be provided.

According to an exemplary embodiment in the present disclosure, the coil component in which a volume of the magnetic body is decreased without a change in inductance to improve economic efficiency, and the board having the same, may be provided.

While exemplary embodiments have been shown and described above, it will be apparent to those skilled in the art that modifications and variations could be made without departing from the scope of the present invention as defined by the appended claims.

What is claimed is:

1. A coil component comprising:
an internal coil;

a magnetic body having the internal coil embedded therein, and having first and second surfaces opposing each other in a first direction, third and fourth surfaces opposing each other in a second direction, and fifth and sixth surfaces opposing each other in a third direction; and external electrodes connected to the internal coil and disposed on outer surfaces of the magnetic body, wherein $0<T1/T2<1$, where T1 is a thickness of the magnetic body at a central axis of the internal coil, and T2 is a thickness of the magnetic body at a point B positioned to be spaced apart from the central axis of the internal coil by a predetermined distance, wherein the external electrodes are not disposed on any portion of the magnetic body where the thickness of the magnetic body is less than or equal to T1.

2. The coil component of claim 1, wherein T2 has a maximum value when the point B is positioned in a region in which the external electrode and the magnetic body overlap each other.

3. The coil component of claim 1, wherein T2 has a maximum value when the point B is positioned in a position most distant from the central axis of the internal coil.

4. The coil component of claim 1, wherein $T1/T2<0.96$.

5. The coil component of claim 1, wherein $0.90<T1/T2<0.96$.

6. The coil component of claim 1, wherein T2 is within the range of 0.5 mm to 0.65 mm.

7. The coil component of claim 1, wherein T1 is larger than a length of the internal coil in the first direction.

8. The coil component of claim 1, wherein the first surface includes a concave region based on the central axis of the internal coil.

9. The coil component of claim 1, wherein the first surface has a concave form based on the central axis of the internal coil.

10. The coil component of claim 1, wherein the second surface includes a concave region based on the central axis of the internal coil.

11. The coil component of claim 1, wherein the second surface has a concave form based on the central axis of the internal coil.

12. The coil component of claim 1, wherein the external electrodes include first and second external electrodes disposed to face each other in the second direction.

13. The coil component of claim 1, wherein the first surface includes a concave region based on the central axis of the internal coil and the second surface has a flat shape.

14. The coil component of claim 1, wherein the first and second surfaces each include a concave region based on the central axis of the internal coil.

15. The coil component of claim 1, wherein the first and second surfaces each include a concave region based on the central axis of the internal coil, and the third and fourth surfaces have a length shorter than T2.

16. A board having a coil component, comprising:
a printed circuit board having a plurality of electrode pads disposed thereon; and
the coil component installed on the printed circuit board, wherein the coil component includes:
an internal coil;
a magnetic body having the internal coil embedded therein, and having first and second surfaces opposing each other in a first direction, third and fourth surfaces opposing each other in a second direction, and fifth and sixth surfaces opposing each other in a third direction; and
external electrodes connected to the internal coil and disposed on outer surfaces of the magnetic body,
wherein $0<T1/T2<1$, where T1 is a thickness of the magnetic body at a central axis of the internal coil, and T2 is a thickness of the magnetic body at a point B positioned to be spaced apart from the central axis of the internal coil by a predetermined distance,
wherein the external electrodes are not disposed on any portion of the magnetic body where the thickness of the magnetic body is less than or equal to T1.

17. The board having a coil component of claim 16, wherein the first surface includes a concave region toward the second surface based on the central axis of the internal coil.

18. The board having a coil component of claim 16, wherein the second surface includes a concave region toward the first surface based on the central axis of the internal coil.

* * * * *